United States Patent [19]
Hill et al.

[11] Patent Number: 5,367,588
[45] Date of Patent: Nov. 22, 1994

[54] METHOD OF FABRICATING BRAGG GRATINGS USING A SILICA GLASS PHASE GRATING MASK AND MASK USED BY SAME

[75] Inventors: Kenneth O. Hill, Kanata; Bernard Y. Malo, Gatineau; Francois C. Bilodeau; Derwyn C. Johnson, both of Nepean, all of Canada

[73] Assignee: Her Majesty in Right of Canada as represented by the Minister of Communications, Ottawa, Canada

[21] Appl. No.: 969,774

[22] Filed: Oct. 29, 1992

[51] Int. Cl.⁵ .................... G02B 6/34; G02B 6/12; H01L 31/18

[52] U.S. Cl. .................... 385/37; 385/14; 385/129; 385/130; 385/147; 359/566; 359/569; 359/573; 359/900; 437/4; 437/51

[58] Field of Search ............ 385/14, 37, 129, 130, 385/131, 147; 359/558, 559, 562, 566, 569, 571, 573, 576, 900; 437/51; 430/4

[56] References Cited

U.S. PATENT DOCUMENTS

| | | | |
|---|---|---|---|
| 4,241,109 | 12/1980 | Johnson | 385/123 |
| 4,806,442 | 2/1989 | Shirasaki et al. | 430/4 |
| 4,807,950 | 2/1989 | Glenn et al. | 359/566 X |
| 4,947,413 | 8/1990 | Jewell et al. | 359/559 X |
| 5,042,897 | 8/1991 | Meltz et al. | 385/37 |
| 5,042,898 | 8/1991 | Morey et al. | 385/37 X |
| 5,058,977 | 10/1991 | Sorin | 385/37 X |
| 5,066,133 | 11/1991 | Brienza | 385/37 X |
| 5,101,297 | 3/1992 | Yoshida et al. | 359/566 |
| 5,104,209 | 4/1992 | Hill et al. | 385/27 |
| 5,175,647 | 12/1992 | Gupta et al. | 359/566 |
| 5,218,651 | 6/1993 | Faco et al. | 385/37 X |
| 5,271,024 | 12/1993 | Huber | 385/37 X |

FOREIGN PATENT DOCUMENTS

| | | | |
|---|---|---|---|
| 0175460 | 3/1986 | European Pat. Off. | 385/37 X |
| 0220652 | 5/1987 | European Pat. Off. | 385/37 X |
| 0271002 | 6/1988 | European Pat. Off. | 385/37 X |

*Primary Examiner*—Brian Healy
*Attorney, Agent, or Firm*—Pascal & Associates

[57] ABSTRACT

An index grating is imprinted in the core of an optical fiber using a specially designed silica glass phase grating mask. The phase mask is held in close proximity to the optical fiber. Laser irradiation of the phase mask with ultraviolet light at normal incidence imprints (photoinduces) into the optical fiber core the interference pattern created by the phase mask.

29 Claims, 4 Drawing Sheets

METHOD OF FABRICATING BRAGG GRATINGS USING A SILICA GLASS PHASE GRATING MASK AND MASK USED BY SAME

FIELD OF THE INVENTION

This invention relates to optical media such as optical fibers, and particularly to a method for fabricating Bragg gratings-therein.

BACKGROUND TO THE INVENTION

Certain optical fiber waveguides exhibit the property of photosensitivity which provides a practical means for photoinducing permanent refractive index changes in the core of those fibers. Photosensitivity is not restricted to fiber structures: it has also been detected in several types of planar glass structures, including, for example, silica-on-silicon and ion-implanted silica waveguides devices.

The fabrication of optical waveguide devices such as intra-mode retro-reflecting Bragg gratings, mode convertor gratings, and rocking rotators have been achieved. The general approach for making these devices is to photoinduce a refractive index grating in the photosensitive core of the optical waveguide. The grating consists of a periodic modulation of the core's refractive index along the length of the waveguide. The period of the perturbation is chosen to bridge the momentum (propagation constant) mismatch between the two (normally bound) modes that the grating is designed to couple. At the resonant wavelength of the structure, phase-matched, efficient, power exchange between the coupled modes is possible.

There are two basic methods used for photoinducing gratings in photosensitive optical fiber waveguides: either by internal or by external writing. Internal writing is usually a holographic process where the modes to be coupled are launched as coherent bound modes of the waveguide and are allowed to modify, by a two-photon absorption process the refractive index of the waveguide core (i.e. form the hologram). Subsequent launching of one mode "reconstructs" the other. The activation wavelength for writing gratings internally in Germanium-doped high-silica glass is in the visible band (for example, at the 514.5 and 488.0 nm Argon-ion laser wavelengths) with corresponding two-photon energy in the U.V. band. External writing uses UV light directly (for germanium doped high-silica fiber, UV light tuned to, or in the vicinity of, the oxygen vacancy absorption band at 240 nm) incident from the side on the optical waveguide. External writing can be accomplished point-by-point, for mode convertor gratings, or using the holographic interference of two coherent UV beams for Bragg retro-reflectors.

Index gratings were first written in optical fibers using a technique described by K.O. Hill et al and disclosed in U.S. Pat. No. 4,474,427. The process requires launching into the core of a Ge-doped fiber strand light having a wavelength in the visible region. The light is reflected from the end of the fiber. The forward propagating light interferes with the backward propagating light to form a standing wave pattern with a period corresponding to half the wavelength of the writing light. Through a photosensitive effect in the fiber, a refractive index grating with this period is written in the core of the fiber. With this technique, only gratings can be fabricated which reflect light having wavelengths close to the writing light.

An improvement on this technique for writing grating has been disclosed by Glenn et al in U.S. Pat. No. 4,807,950. In that process, the gratings are produced in the fiber by illuminating the fiber from the side with a coherent ultraviolet radiation having 245 nm wavelength. By using a two beam technique, an interference pattern is set up along the length of the fiber. The period of the pattern is controlled by controlling the angle between the interfering beams. Thus index gratings can be written in the fiber which will reflect light at much longer wavelengths.

A further improvement on the above-noted methods for writing gratings in optical fibers is the point-by-point writing technique which is disclosed in U.S. Pat. No. 5,104,209. In this patent, a point-by-point technique for writing gratings in fibers is disclosed in which each index perturbation in the grating is photoinduced individually through a slit-mask.

The principal drawbacks of the grating fabrication technique described in the first patent is that only gratings with a period similar to that of one half the wavelength of the writing light can be made. The second patent discloses a method of writing gratings with a different pitch. However, the technique requires an ultraviolet laser source with a high degree of spatial and temporal coherence. Such laser sources are research lasers that are expensive, have low writing efficiencies and are not suitable for use in a manufacturing environment. Furthermore, the technique does not provide full flexibility in the writing of apodized Bragg reflectors or chirped Bragg reflectors.

The point-by-point writing method is an effective technique for writing the coarse period gratings needed in spatial and polarization mode converters. However, this technique is not practical for writing Bragg gratings. In the case of Bragg gratings, the writing of each index perturbation individually requires high accuracy in the translation of the optical fiber in front of the slit. A more serious drawback, is the serial manner for writing the index perturbations forming the Bragg grating. That writing process needs a very long exposure time to fabricate a single Bragg reflector. U.S. Pat. No. 5,104,209 proposes to overcome this problem by the use of slit-masks to permit the writing of several index perturbations in a single operation.

SUMMARY OF THE INVENTION

In the present invention the index grating is imprinted in the core of the optical fiber using a specially designed silica glass phase grating mask. The phase mask is held in close proximity to the optical fiber. Laser irradiation of the phase mask with ultraviolet light at normal incidence imprints (photoinduces) into the optical fiber core the interference pattern created by the phase mask.

The present invention improves on the point-by-point writing technique by using a novel slit-mask for printing Bragg gratings in optical fibers and planar optical waveguides. The method is a non-holographic technique for writing Bragg retro-reflectors and is particularly applicable to photosensitive optical fiber, but the method applies as well to planar waveguide structures.

In accordance with an embodiment of the invention, a method of fabricating Bragg gratings in an optical medium is comprised of disposing a silica glass phase grating mask adjacent and parallel to a photosensitive optical medium and applying a collimated light beam through the mask to the medium.

In accordance with another embodiment a phase grating slit-mask is used to modulate spatially the phase of a UV beam (for example, from an excimer laser) with pitch $$\frac{\lambda_{Bragg}}{n_{Effective}},$$

where $\lambda_{Bragg}$ is the desired resonant wavelength for retro-reflective intra-mode coupling in the fiber and $n_{Effective}$ is the effective index of the coupled modes at $\lambda_{Bragg}$.

In accordance with another embodiment, a grating mask is comprised of a slab of silica glass having parallel corrugations on a surface thereof forming a surface relief pattern.

BRIEF INTRODUCTION TO THE DRAWINGS

A better understanding of the invention will be obtained by reference to the detailed description below, in conjunction with the following drawings, in which:

FIG. 1 is a diagram of photolithographic apparatus for photo-imprinting a refractive index Bragg grating in a photosensitive optical fiber waveguide, FIGS. 2, 3, 4 and illustrate additional diagrams of photolithographic apparatus for photo-imprinting a Bragg grating in an optical fiber, and FIG. 6 is a graph of spectral response of a Bragg grating fabricated with a UV laser source and using phase-mask photolithography.

DETAILED DESCRIPTION OF THE INVENTION

Figure 1A:
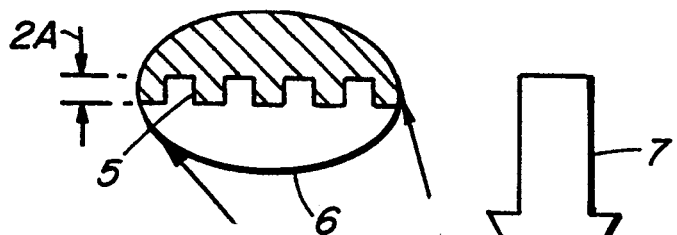

A phase grating slit-mask 1 is used in a precision photolithographic apparatus and is placed in contact, or near-contact, with an optical fiber 3, its grating striations 5 (as illustrated in magnification 6 of the mask) directed normal or near normal to the fiber axis. A UV light beam 7 from a suitable laser, a KrF excimer laser (249 nm) in a successful prototype is passed through the mask 1 by which it is phase modulated spatially and is diffracted to form an interference pattern 9A laterally (Bragg grating pitch) and along the incident laser beam direction 9B (Talbot pitch) as illustrated in magnification 11 of the core of the fiber.

The slit-mask preferably is comprised of a one dimensional surface-relief structure as shown at 6 fabricated in a high quality fused silica flat transparent to the KrF excimer laser radiation. The shape of the periodic surface-relief pattern of the phase mask preferably approximates a square wave in profile, as shown at 6. The amplitude of the periodic surface-relief pattern is chosen to modulate by $\pi + 2\pi n$ radians ($n=0,1,2,3,\ldots$) the phase of the UV light beam. In a successful prototype of the phase mask for a KrF excimer laser beam, the amplitude A of the surface relief pattern is given by $$\frac{4\pi(n_{silica} - 1)A}{\lambda_{KrF}} = \pi,$$

where $\lambda$ is the wavelength of the light used for writing (photoinducing) an index charge in the optical medium, and $n_{silica}$ is the refractive index of the silica used in forming the mask. This choice of surface-relief-grating amplitude results in a grating diffraction pattern for the design wavelength that nulls the zero-order diffracted (through) beam. In practice, the zero-order beam 13 has been suppressed to less than 5% of the light diffracted by the mask. The principal beams 15 exiting our mask are the diverging plus-one and minus-one orders each of which contained typically more than 35% of the diffracted light.

The mask perturbations need not be shaped to a square wave. For example, zero-order nulled surface-relief phase-grating masks having perturbations with a sinusoid shape would be equally useful in our application.

To manufacture Bragg gratings with a length longer than the phase mask, a stop and repeat process can be used. In this process, the mask (or fiber) is translated precisely a distance corresponding to the fringe pattern length such that subsequent photoimprinted gratings reflect in phase with previously photoimprinted grating.

It is worth noting that the principal period of the mask's diffraction pattern is independent of wavelength. Therefore, in principle, it is possible to write a Bragg grating with a collimated broadband source, as long as the waveguide core is not located too far away from the phase mask during writing and the combined spectral width of the source and the photosensitive band of the waveguide material is not broader than the nulling bandwidth for the zero-order diffracted beam.

For photoimprinting Bragg reflectors, the preferred placement of the phase grating striations is normal to the fiber axis. Tilted index gratings can be photoimprinted by placing the phase grating striations at an angle to the fiber axis. Such index grating structures are useful for coupling core guided light out the fiber and into free space.

It should be noted that the preferred embodiment has the grating striations of the surface relief phase grating face the fiber. This configuration is not necessary for the phase grating to phase modulate the UV beam. A configuration with the striations facing away from the fiber functions will also work.

Phase gratings in which the phase modulation is produced by a refractive index modulation rather than a surface relief modulation will function as well. For example, the striations 5 of the mask shown in magnification 6 of FIG. 1 can be filled with glass material having a different index of refraction than the surrounding regions, producing alternating refractive indexes.

In order to test the performance of the photolithographic apparatus we have described for photo-imprinting a refractive Bragg grating in a photosensitive optical fiber waveguide, we selected two optical fibers known to be highly photosensitive. The first was an Andrew Corporation standard D-type polarization-maintaining fiber optimized for 1300 nm (cut-off=960 nm, beat length $L_B$=1.02 cm at 1292 nm, core/cladding $\Delta n$=0.031 and elliptical core size 1.5×3$\mu$m) but which nonetheless exhibits sufficiently low loss at the Bragg resonant wavelength of 1531 nm that we use in our experiments. This fiber has a core that is highly doped with Germanium in comparison with standard telecommunications fiber; Germanium-doped fibers are usually photosensitive. In particular, Andrew D-type fiber has been reported to be strongly photosensitive (we measured unsaturated photoinduced refractive index changes of the order of $6 \times 10^{-4}$), an attribute linked to its relatively high Germanium dopant concentration. The second fiber was obtained from AT&T Bell Laboratories and was specially formulated to be strongly photosensitive. Our experiments confirmed that the AT&T fiber was more photosensitive than the D-type fiber for the conditions prevalent during our experiments.

The UV source we used in our experiments was an unmodified Lumonics KrF excimer laser operated at 249 mn, with a beam cross-section $0.7 \times 2$ cm$^2$, pulse duration 12 nsec and pulse repetition rate of 50 Hz. The unfocused energy density per pulse was 100 mJ per cm$^2$. Such a laser produces a low coherence beam when no provision is made either to injection-lock or to filter spatially the beam. The only optimization we undertook in preparation for writing a Bragg grating was to place the phase mask grating with its striations parallel to the long dimension of the beam cross-section, because we determined experimentally that the spatial coherence is better for its placement than for an orthogonal placement.

Successful writing with low coherence beams was an important test of the performance of the present photolithographic Bragg grating photo-imprinting method. An advantage of Bragg grating photolithography is it provides a means for the fabrication of several devices in parallel, permits the use of proven, high-fluence, industrial laser sources and simplifies manufacturing alignment procedures.

The phase grating that we used in the successful prototype method was a surface-relief device manufactured on a high optical quality fused silica flat. The period of the grating was approximately 1060 nm with 249 nm zero-order diffracted beam nulled below 5% and 37% of transmitted light in each of the plus- and minus-one diffracted beams. The grating measured 1 mm square. The period of the Bragg grating photo-imprinted with the flat was 530 nm resulting in an estimated high-fused-silica-waveguide (refractive index=1.46) Bragg resonance wavelength of $530 \times 2 \times 1.46 = 1549$ nm. We observed experimentally a resonance at 1531 nm.

The fluence level per pulse used for Bragg grating exposure was increased from 100 to 200 mJ/cm$^2$ by mild focusing of the excimer laser beam, using a cylindrical lens aligned with cylinder axis parallel to the fiber. Typical exposure times are a few minutes long with fluence levels of 1 joule/cm$^2$ per pulse and pulse rates of 50 ppc. The photoinduced Bragg grating reflectivity increases rapidly at the beginning of the exposure process and then saturates subsequently at a value related to the level of the incident fluence per pulse. A larger fluence level per pulse increases, to some limit, the saturated reflectivity of the ensuing Bragg grating. However, above a certain fluence level, a peak in reflectivity is obtained, and further photoexposure results in decreased reflectivity and at the same time the shape of the wavelength response of the Bragg grating changes significantly developing, for example, a notch at the center wavelength of the response.

Figure 2:
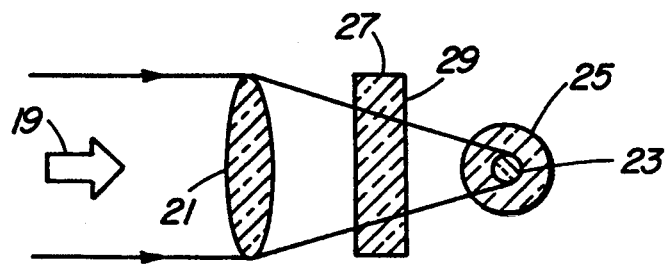

It should be noted that a lens or lenses can be used for increasing the fluence level. For example, an embodiment is shown in FIG. 2.

A light source 19 is focussed by a cylindrical lens 21 to the core 23 of optical fiber 25, through phase grating slit mask 27, which has its face 29 containing the grating striations facing the fiber.

Figure 3:
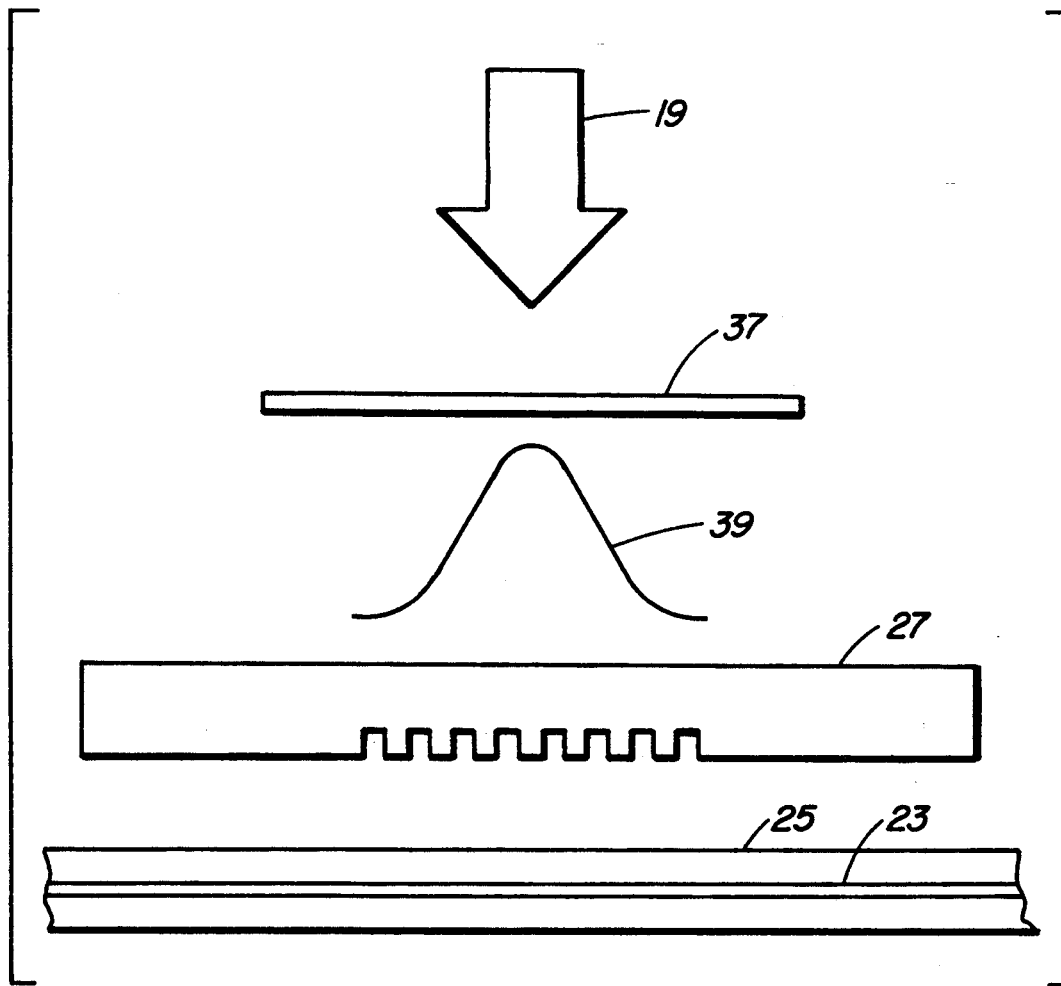

In another embodiment of the invention shown in FIG. 3, a spatial amplitude or filter 37 is disposed in front of the phase mask 27. The spatial amplitude filter 37 modifies the intensity profile 39 of the UV beam so it varies along the length of the phase grating in a predetermined way. The profile 39 indicates for example a UV beam with gaussian intensity profile. Illumination of the phase grating with the UV beam 19 results as before in an interface pattern. The envelope of the interference fringes however has the same intensity profile along the length the fiber as the intensity profile of the UV beam. The regions of high intensity result in a larger photoinduced refractive index change than the regions of low intensity. Thus an index grating can be formed in a fiber whose coupling strength varies in a predetermined way along the fiber length.

Figure 4:
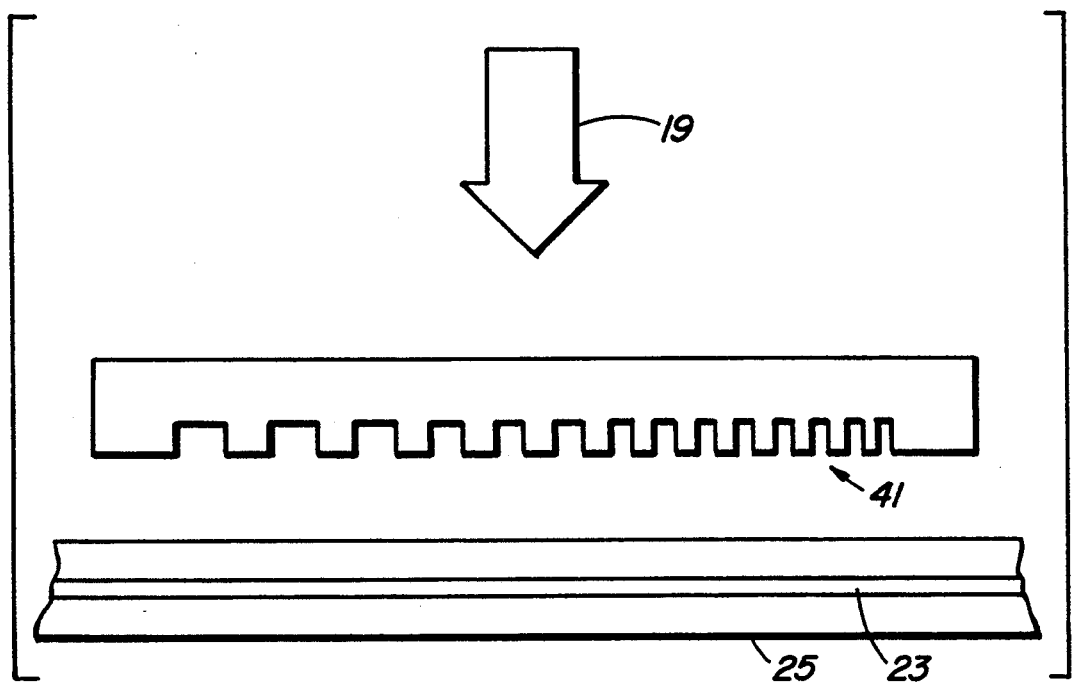

In another embodiment of the invention shown in FIG. 4, a phase grating 41 is used in which the grating period varies along the length of the grating in a predetermined manner, to form a chirped grating. Irradiation of the chirped phase grating with UV light 19 photoimprints an index grating (reflector) in the fiber core 23 that is also chirped. The spectral response of the chirped Bragg reflector is broader than that of the Bragg reflector resonant at a single wavelength.

Simultaneous use of the two embodiments shown in FIGS. 3 and 4 modulates spatially the phase and amplitude of the UV beam allowing independent control respectively of the resonant frequency and the strength of the resonance along the length of the Bragg reflector. This capability permits the synthesis of useful spectral response characteristics such as an apodized Bragg reflector.

Figure 5:
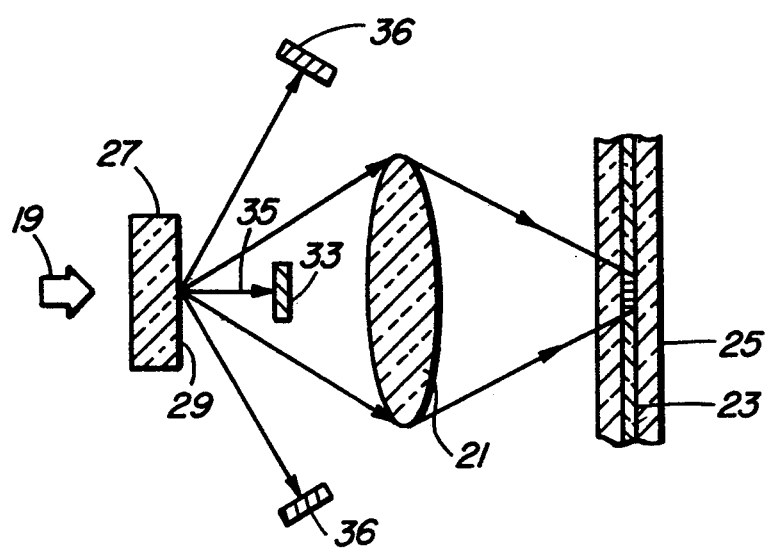

FIG. 5 illustrates an embodiment of the invention in which the lens is located between the mask 27 and the optical fiber 25. An opaque blocker 33 is located between the mask and the lens to block the zero order light beam 35. Opaque beam blockers 36 are also located between the mask and the lens to block light diffracted into beams higher than the first order. The plus one and minus one orders of the light beam are passed through the lens.

The advantage of this embodiment is that only the first order diffracted beams are used in forming the interference fringes and high contrast fringes are obtained. A further advantage is that the lens can be used for reducing the image size of the fringe pattern. Thus lenses that produce different image reductions will photoimprint Bragg gratings with different resonant frequencies from the same phase grating. Also, the pitch of the phase grating can be longer thus relaxing the difficulty in manufacturing the phase grating. Finally, the lens provide a means for increasing the fluence levels on the irradiated optical core.

Figure 1:
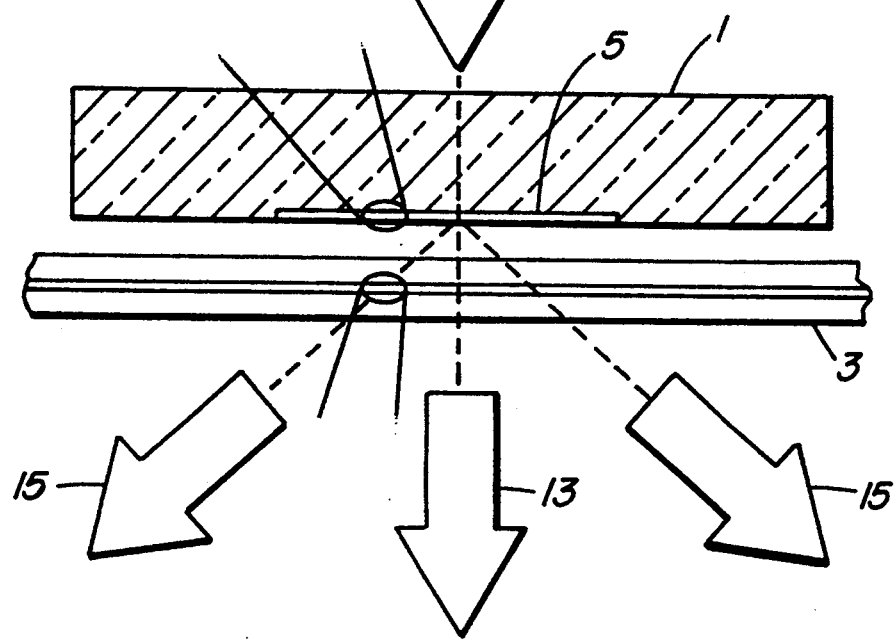
Figure 1B:
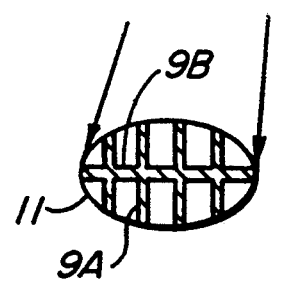
Figure 6:
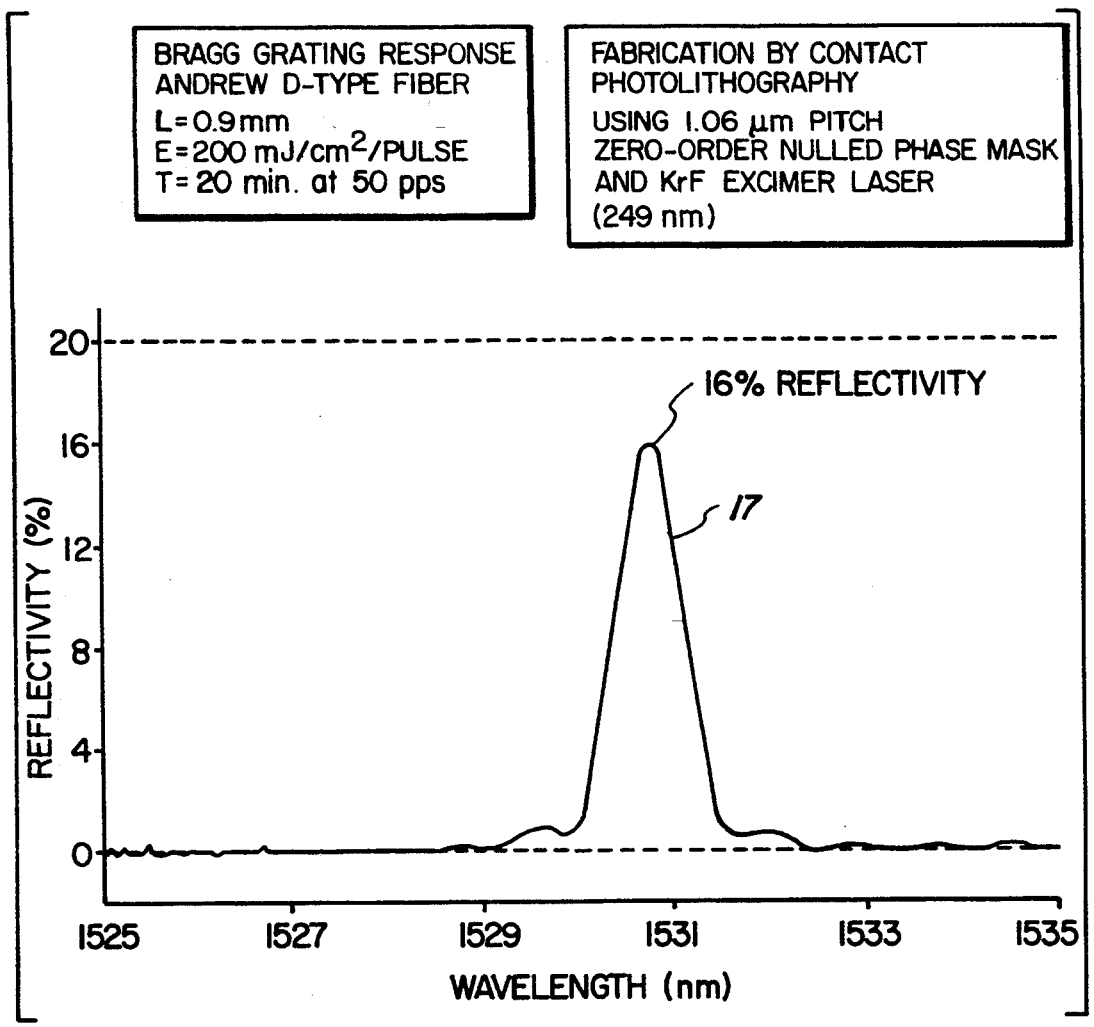

FIG. 6 illustrates a spectral response graph 17 of a Bragg grating photo-imprinted through the above-described phase mask in the embodiment of FIG. 1 into the Andrew Corp. D-type fiber. The 249 nm KrF excimer laser irradiated the fiber for 20 minutes with 100 mJ/cm$^2$ pulses at 50 pps. A peak reflectivity of 16% was achieved in a grating estimated to be approximately 0.95 mm long, which is calculated assuming a uniform in-fiber grating and using the 0.85 nm spectral width of the response, the 530 nm pitch of the Bragg grating and the 1531 nm Bragg resonance wavelength. The sidebands in the spectral response are clearly visible, suggesting that the grating is substantially uniform along its entire length. From the grating reflectivity data we calculated (in the tightly bound mode limit) the amplitude for the refractive index modulation to be $2.2 \times 10^{-4}$. This value compares favourably with the average refractive index change which we determined to be $6 \times 10^{-4}$ from the shift in Bragg grating resonance during photo-exposure and knowledge of the fiber's effective index dispersion at 1531 nm. Ideally, we expect the apparent modulation depth to be the same or larger than the average index change when we expose fibers to maximum-contrast grating-diffraction patterns. The depth-to-average-index change ratio is influenced by the following intrinsic factors: non-linearities in the photosensitive response of the fiber, the less-than-perfect nulling of the zero-order beam, the presence of higher-order diffracted beams down stream from the mask and the low coherence of the laser source. It is also influenced by fiber/mask alignment during fabrication: the reflectivity of the photoinduced Bragg grating will be reduced if the grating is tilted with respect to the fiber axis. The low reflectivity from tilting translates to a reduced apparent depth of modulation of the refractive index. Tilting does not affect the increase in the average refractive index due to photoexposure.

A Bragg grating spectral response similar to FIG. 6 was observed for a Bragg grating written under similar conditions but using the special AT&T fiber. In that case the peak reflectivity reached 25%.

In comparison to other methods of making in-fiber Bragg gratings, the technique of photolithographic imprinting through the phase mask as described herein offers much flexibility for modifying the pitch and the strength of the Bragg grating coupling coefficient, $\kappa(z)$, as a function of distance z along the waveguide axis. Intricate variations in pitch can be written into the phase mask during its fabrication e.g. under computer control; a spatial amplitude mask can be used as well to grade the strength of the coupling coefficient. Simultaneous use of these two techniques to modulate spatially the phase and amplitude of the UV writing beam allows independent control respectively of the resonant frequency and the strength of resonance along the waveguide Bragg grating written with the mask, making the synthesis of some useful spectral responses possible.

The surface-relief phase grating masks used have been found to tolerate fluence levels per pulse of 1 J/cm² without damage. Because fused quartz has a damage threshold per pulse of about 5 J/cm² under KrF excimer laser irradiation, it seems likely that these phase masks can tolerate even higher fluence levels.

Using a fluence level per pulse of 1 J/cm² we photoimprinted a Bragg grating with 30% reflectivity in Andrew D-fiber after a 5 minute 50 Hz exposure.

The present invention thus provides a simple method for fabricating high-quality Bragg gratings in photosensitive optical waveguides, using low coherence lasers suitable for industrial environments. The combination of phase mask photo-imprinting with single-pulse writing of in-fiber Bragg gratings could yield high-performance, low-cost devices.

A person understanding this invention may now conceive of alternative structures and embodiments or variations of the above. All of those which fall within the scope of the claims appended hereto are considered to be part of the present invention.

We claim:

1. A method of fabricating Bragg gratings in the interior of an optical waveguide comprising disposing a silica glass phase grating mask adjacent and parallel to a photosensitive optical waveguide and applying a single collimating light beam through the mask to said medium.

2. A method as defined in claim 1 in which the mask has a surface relief pattern selected to modulate by approximately $\pi + 2\pi n$ radians the phase of the light beam, wherein $$\frac{4\pi(n_{silica} - 1)A}{\lambda} = \pi + 2\pi n$$

where A is the amplitude of the surface relief pattern, n=0,1,2,3, $\lambda$ is the wavelength of the light used for writing (photoinducing) an index change in the optical medium and $n_{silica}$ is the refractive index of the silica used in the mask at $\lambda$.

3. A method as defined in claim 2 in which the surface relief pattern in cross-section is a square-wave.

4. A method as defined in claim 2 in which the surface relief pattern in cross-section is a sine wave.

5. A method as defined in claim 1 in which the light beam is an ultraviolet light beam.

6. A method as defined in claim 5 in which the light beam is a laser beam.

7. A method as defined in claim 1 in which the light beam is provided by a KrF excimer laser.

8. A method as defined in claim 1 in which the optical medium is an optical fiber.

9. A method as defined in claim 8 in which striations of the phase mask grating are oriented orthogonal to or nearly orthogonal to the axis of the fiber.

10. A method as defined in claim 8 in which striations of the phase mask grating are oriented at an angle to the axis of the fiber.

11. A method as defined in claim 9 in which the light beam is provided by a KrF excimer laser.

12. A method as defined in claim 11 in which the mask has a surface relief pattern selected to modulate by approximately $\pi + 2\pi n$ n=0,1,2,3, radians the phase of the light beam, wherein $$\frac{4\pi(n_{silica} - 1)A}{\lambda} = \pi + 2\pi n$$

n=0,1,2,3 where A is the amplitude of the surface relief pattern, $\lambda$ is the wavelength of the light and $n_{silica}$ is the refractive index of the silica material used to make the mask at $\lambda$.

13. A method as defined in claim 12 in which the surface relief pattern in cross-section is a square-wave.

14. A method as defined in claim 13, in which a large dimension of the light beam cross-section is oriented parallel to striations of the phase mask grating.

15. A method as defined in claim 8 in which the striations are chirped.

16. A method as defined in claim 9 in which the striations are chirped.

17. A method as defined in claim 9 in which the phase mask contains variations in either or both of pitch and amplitude of the striations.

18. A method as defined in claim 11 in which the light beam is an ultraviolet beam.

19. A method as defined in claim 1 including locating a refracting lens between the mask and the optical medium prior to applying the light beam.

20. A method as defined in claim 19 including placing an opaque blocking means for the zero order light beam between the mask and the lens prior to applying the light beam.

21. A method as defined in claim 19 including placing opaque blocking means for the zero and second order light beams between the mask and the lens prior to applying the light beam.

22. A method as defined in claim 1 further including a spatial amplitude light filter for shaping the beam profile prior to passing through the phase grating.

23. A method as defined in claim 22 in which the filter is coated on a face of the mask opposite to a face containing the phase grating.

24. A method as defined in claim 2, then repeatedly moving one of the mask and medium relative to the other a distance corresponding to the fringe pattern and applying said collimating light beam through the mask to said medium, such that subsequent photoimprinted gratings reflect in phase with previously photoimprinted gratings.

25. A grating mask comprising a slab of silica glass having parallel corrugations on a surface thereof forming a surface relief pattern, the pattern containing variations in at least one of pitch and amplitude of the corrugations.

26. A grating means comprising a slab of silica glass having parallel corrugations on a surface thereof forming a surface relief pattern, including a spacial amplitude light filter coated on a surface of the slab opposite to the surface carrying said pattern.

27. A grating as defined in claim 25 further including a spacial amplitude light filter coated on a surface of the slab opposite to the surface carrying said pattern.

28. A grating means comprising a slab of silica glass having parallel corrugations on a surface thereof forming a surface relief pattern, in which the corrugation are filled with transparent material having an index of refraction different from that of the silica glass.

29. A grating as defined in claim 28 in which the transparent material is comprised of glass.

* * * * *